(12) United States Patent
Katoh et al.

(10) Patent No.: US 11,187,468 B2
(45) Date of Patent: Nov. 30, 2021

(54) LOOP HEAT PIPE WICK, LOOP HEAT PIPE, COOLING DEVICE, AND ELECTRONIC DEVICE, AND METHOD FOR MANUFACTURING POROUS RUBBER AND METHOD FOR MANUFACTURING LOOP HEAT PIPE WICK

(71) Applicant: RICOH COMPANY, LTD., Tokyo (JP)

(72) Inventors: Kiyotada Katoh, Kanagawa (JP);
Tomoyasu Hirasawa, Kanagawa (JP);
Norihiko Aze, Kanagawa (JP); Takeshi Endoh, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 15/844,812

(22) Filed: Dec. 18, 2017

(65) Prior Publication Data

US 2018/0180360 A1   Jun. 28, 2018

(30) Foreign Application Priority Data

Dec. 28, 2016 (JP) .............................. JP2016-255331
Apr. 26, 2017 (JP) .............................. JP2017-087547

(51) Int. Cl.
*F28D 15/04* (2006.01)
*H01L 23/427* (2006.01)
*F28D 15/02* (2006.01)
*F28D 20/02* (2006.01)

(52) U.S. Cl.
CPC ....... *F28D 15/046* (2013.01); *F28D 15/0283* (2013.01); *F28D 15/043* (2013.01); *F28D 20/023* (2013.01); *H01L 23/427* (2013.01)

(58) Field of Classification Search
CPC ...... F28D 15/02; F28D 15/0266; F28D 15/04; F28D 15/043; F28D 15/046
See application file for complete search history.

(56) References Cited

U.S. PATENT DOCUMENTS

| 4,765,396 A | * | 8/1988 | Seidenberg | ........... F28D 15/043 |
| | | | | 122/366 |
| 6,840,310 B2 | | 1/2005 | Tonosaki et al. | |
| 2008/0277099 A1 | * | 11/2008 | Takamatsu | ............. F28D 15/043 |
| | | | | 165/104.26 |
| 2011/0030927 A1 | | 2/2011 | Okano et al. | |
| 2011/0052247 A1 | | 3/2011 | Saitoh et al. | |
| 2012/0205079 A1 | * | 8/2012 | Jewell-Larsen | .... H05K 7/20172 |
| | | | | 165/104.34 |

(Continued)

FOREIGN PATENT DOCUMENTS

| CN | 101131307 A | 2/2008 |
| CN | 101799250 A | 8/2010 |
| CN | 102961786 A | 3/2013 |

(Continued)

OTHER PUBLICATIONS

Wu, Study of PTFE wick structure applied to loop heat pipe, Applied Thermal Engineering (Year: 2015).*

(Continued)

*Primary Examiner* — Eric S Ruppert
(74) *Attorney, Agent, or Firm* — Xsensus LLP

(57) ABSTRACT

A loop heat pipe wick includes porous rubber.

12 Claims, 2 Drawing Sheets

(56) References Cited

U.S. PATENT DOCUMENTS

2012/0279682 A1* 11/2012 Bonnet ............... F28D 15/0266
165/62

FOREIGN PATENT DOCUMENTS

| JP | S61-105097 | A |   | 5/1986  |           |
|----|------------|---|---|---------|-----------|
| JP | 02286200   | A | * | 11/1990 |           |
| JP | 2002012696 | A | * | 1/2002  | C08J 9/32 |
| JP | 2002040830 | A |   | 2/2002  |           |
| JP | 2005126480 | A |   | 5/2005  |           |
| JP | 2008-116681 |  |   | 5/2008  |           |
| JP | 2009-128845 |  |   | 6/2009  |           |
| JP | 2010-107153 |  |   | 5/2010  |           |
| JP | 2011-034007 |  |   | 2/2011  |           |
| JP | 2011-070157 |  |   | 4/2011  |           |
| JP | 2011-190996 |  |   | 9/2011  |           |
| JP | 2011190996 |   | * | 9/2011  |           |
| JP | 2011-247462 |  |   | 12/2011 |           |
| WO | 2012/049752 | A1 |  | 4/2012  |           |

OTHER PUBLICATIONS

Wu, Investigation of the Polymer Wick Structure Applied to Loop Heat Pipe, IEEE (Year: 2009).*

Nagano, Small Loop Heat Pipe with Plastic Wick for Electronics Cooling, Japanese Journal of Applied Physics (Year: 2011).*

Feng, One-way wicking in open micro-channels controlled by channel topography, Journal of Colloid and Interface Science (Year: 2013).*

Extended European Search Report dated May 29, 2018 in European Patent Application No. 17205975.0, 6 pages.

Office Action and Search Report dated Apr. 19, 2019 in the corresponding Chinese Patent Application No. 201711421159.0 with English Translation of Category of Cited Documents 11 pages.

Office Action dated Nov. 8, 2019, issued in corresponding Chinese Patent Application No. 201711421159.0, 8 pages.

Rongze et al., Measurement of powder particles and pores, Feb. 28, 1982, 8 pages (with partial English Translation).

Office Action dated May 21, 2020, issued in corresponding Chinese Patent Application No. CN201711421159.0, 7 pages.

Technology and principle of rubber plastic combination—Oct. 31, 1991, 4 pages with English Translation.

Office Action dated Nov. 23, 2020 in Chinese Patent Application No. 201711421159.0, 6 pages.

Xie Shengying, 7.5 Foaming agent; and 7.5.1 Physical foaming agent, ISBN 978-7-5019-7113-8, Jan. 31, 2010, 6 pages.

Bai Shizhen, et al., (I) Artificial heart assist device; (II) Medical hose; (III) Prosthesis; (IV) Elastic bandage; (V) Medical artificial leather; and (VI) Medical gloves, ISBN 978-7-5047-4906-2, Jun. 30, 2014, 6 pages.

Office Action dated Nov. 12, 2020, issued in corresponding Japanese Patent Application No. 2017-087547, 3 pages.

Office Action dated Apr. 8, 2021 in Japanese Patent Application No. 2017-087547, 2 pages.

* cited by examiner

LOOP HEAT PIPE WICK, LOOP HEAT PIPE, COOLING DEVICE, AND ELECTRONIC DEVICE, AND METHOD FOR MANUFACTURING POROUS RUBBER AND METHOD FOR MANUFACTURING LOOP HEAT PIPE WICK

CROSS-REFERENCE TO RELATED APPLICATIONS

This patent application is based on and claims priority pursuant to 35 U.S.C. § 119 to Japanese Patent Applications No. 2016-255331, filed on Dec. 28, 2016, and No. 2017-087547, filed on Apr. 26, 2017 in the Japanese Patent Office, the entire disclosures of which are hereby incorporated by reference herein.

BACKGROUND

Technical Field

The present disclosure relates to loop heat pipe wicks and loop heat pipes, and to cooling devices and electronic devices using the wicks. Furthermore, the present disclosure relates to methods for manufacturing porous rubber and loop heat pipe wicks.

Background Art

Recently, a compact and highly efficient loop heat pipe is used as a cooling device for suppressing temperature rise due to heat from a heat-generating part in electronic equipment and the like.

Generally, as illustrated in FIG. 5, the loop heat pipe includes an evaporator 100 that receives heat from an outside source and evaporates a working fluid from a liquid phase to a gas phase, a condenser 200 that releases heat and condenses the working fluid from the gas phase to the liquid phase, a vapor line 300 that allows a gas-phase working fluid to flow from the evaporator 100 to the condenser 200, and a liquid line 400 that allows the working fluid in its liquid phase to flow from the condenser 200 to the evaporator 100.

A wick 500 made of a porous material is accommodated in the evaporator 100. The liquid-phase working fluid circulated from the liquid line 400 permeates fine pores in the wick 500 by capillary action and seeps out to the outer surface of the wick 500. Heat from the heat-generating part (an object to be cooled) in contact with the evaporator 100 passes through a casing of the evaporator 100 and is transmitted to the wick 500. The heat evaporates the working fluid and turns it into a gas. The working fluid changed to the gas-phase moves to the condenser 200 through the vapor line 300. In the condenser 200, the heat of the working fluid is released, the temperature of the working fluid lowers, and a phase of the working fluid changes to the liquid-phase. The working fluid changed to the liquid-phase moves to the evaporator 100 through the liquid line 400, and permeates the wick 500 again. As described above, the loop heat pipe utilizes the phase change of the working fluid, circulates the working fluid, transfers the heat absorbed by the evaporator to the condenser, and efficiently cools the object to be cooled.

In order to transfer the heat of the heat-generating part to the wick in the evaporator 100 efficiently, adhesion of the wick with the casing of the evaporator is important. If the wick does not contact the casing sufficiently, heat transfer efficiency from the casing to the wick is reduced, and the evaporation efficiency of the working fluid is lowered. As a result, a cooling performance of the loop heat pipe deteriorates.

In order to ensure sufficient contact between the wick and the casing, generally, the wick is made of a resin material, and the outer diameter of the wick is formed slightly larger than the inner diameter of the casing. However, when the wick having an excessively large outside diameter due to a manufacturing error is accommodated and compressed in the casing, pores in the wick collapse in the vicinity of the outer peripheral surface of the wick. This collapse of the pores may hinder the flow of the working fluid and degrade the cooling performance.

SUMMARY

This specification describes an improved loop heat pipe wick, which, in one illustrative embodiment, is constructed of porous rubber. Additional embodiments disclose an improved cooling device, electronic device, and methods for manufacturing porous rubber and wicks for loop heat pipes.

BRIEF DESCRIPTION OF THE SEVERAL VIEWS OF THE DRAWINGS

A more complete appreciation of the embodiments and many of the attendant advantages and features thereof can be readily obtained and understood from the following detailed description with reference to the accompanying drawings, wherein.

DETAILED DESCRIPTION OF THE EMBODIMENTS

Figure 1:
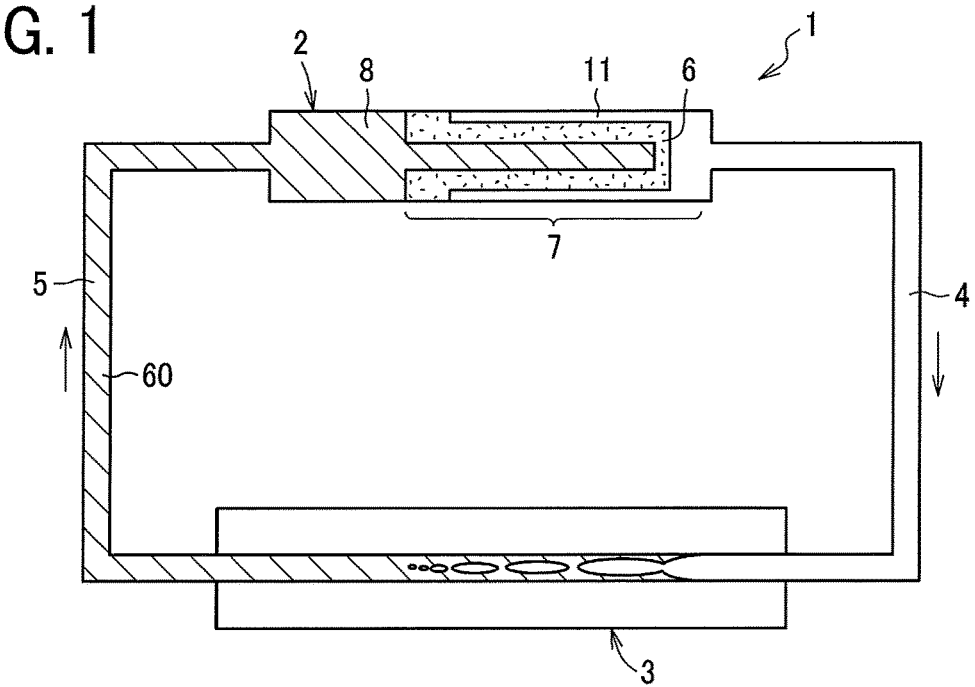
FIG. 1 is a schematic diagram illustrating a loop heat pipe according to an embodiment of the present disclosure.

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

The configurations related to the present disclosure are described based on embodiments illustrated in the accompanied drawings from FIGS. 1 to 4.

Hereinafter, the present disclosure is described with reference to the accompanying drawings. It is to be noted that, in the drawings for explaining exemplary embodiments of this disclosure, identical reference numerals are assigned as long as discrimination is possible to components such as members and component parts having an identical function or shape, thus omitting description thereof once it is provided.

FIG. 1 is a schematic diagram illustrating a loop heat pipe according to an embodiment of the present disclosure.

A working fluid 60 is sealed in the interior of the loop heat pipe 1 illustrated in FIG. 1. The loop heat pipe 1 includes an evaporator 2 that absorbs heat from a heat-generating part and evaporates the working fluid 60 from a liquid phase to a gas phase, a condenser 3 that condenses a gas-phase working fluid 60 led from the evaporator 2 into the liquid phase, a vapor line 4 that allows the gas-phase working fluid 60 to flow from the evaporator 2 to the condenser 3, and a liquid line 5 that allows a liquid-phase working fluid 60 to flow from the condenser 3 to the evaporator 2.

The evaporator 2 is a cylindrical member formed of a metal having good thermal conductivity such as copper or a copper alloy. The evaporator 2 includes a heat receiving portion 7 in which the wick 6 is accommodated and a reservoir 8 that stores the liquid-phase working fluid 60. The heat receiving portion 7 is coupled to an end of the vapor line 4, and the reservoir 8 is coupled to an end of the liquid line 5. The other end of each of the vapor line 4 and the liquid line 5 is coupled to the condenser 3. The condenser 3 is a stainless steel pipe having a large number of thin plate-shaped fins made of aluminum on its outer peripheral surface.

The wick 6 is a hollow member made of a porous material. The wick 6 is open on the vapor line 4 side and closed on the reservoir 8 side. A plurality of grooves 11 extending in the longitudinal direction are disposed on the outer peripheral surface of the wick 6 over an area from an end of the wick 6 in the vapor line 4 side to a short distance from another end of the wick 6 of the reservoir 8 side.

Figure 2:
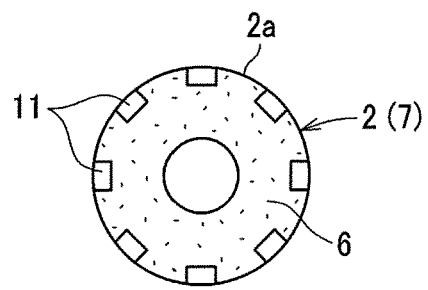
FIG. 2 is a cross-sectional view of an evaporator in the loop heat pipe.

As illustrated in FIG. 2, the grooves 11 are disposed at equal intervals around the circumference of the wick 6. An outer diameter of a portion of the wick 6 where the groove 11 is not disposed is somewhat larger than an inner diameter of a casing 2a of the evaporator 2. Therefore, in a state in which the wick 6 is accommodated in the evaporator 2, the wick 6 is pressed against the inner peripheral surface of the casing 2a of the evaporator 2 in the portion where the groove 11 is not disposed. The adhesion between the wick 6 and the casing 2a of the evaporator 2 makes it possible to transfer the heat of the heat-generating part to the wick 6 through the casing 2a of the evaporator 2 efficiently. Further, the wick 6 separates the liquid-phase and the gas-phase of the working fluid 60, and functions to prevent the gas-phase working fluid 60 from flowing back to the reservoir 8. On the other hand, in a portion where the groove 11 is disposed, a space portion is formed between the wick 6 and the casing 2a of the evaporator 2.

Since the wick 6 is made of a porous material, the liquid-phase working fluid 60 stored in the reservoir 8 permeates the wick 6 by capillary action. By capillary action, the wick 6 also functions as a pump for circulating the liquid-phase working fluid 60 from the condenser 3 to the evaporator 2. As the working fluid 60, condensable fluids such as water, alcohol, acetone, substitute Freon, fluorinated solvent and the like are used. In addition, it is preferable that the working fluid 60 has good wettability with the wick 6 to facilitate permeation of the wick 6. The wettability can be measured by a contact angle between the wick 6 and the working fluid 60. Contact angles of less than 90° are desirable because contact angles greater than 90° make it difficult for the working fluid 60 to permeate the wick 6.

The combination of the working fluid 60 and the wick material is preferably a combination in which it is difficult to dissolve the wick material in the working fluid 60. The solubility of the wick material with respect to the working fluid 60 can be based on a solubility parameter (a solubility parameter (SP) value). The SP value is a value indicating the polarity of the substance. As the difference between the SP values of two substances increases, the two substances are less soluble with each other. From the viewpoint of solubility, it is preferable that the combination of the working fluid 60 and the wick material used for the loop heat pipe 1 is such that the SP value of the working fluid 60 is larger than the SP value of the wick material.

The loop heat pipe 1 according to the present embodiment transmits the heat as follows. The heat from the heat-generating part is transmitted to the liquid-phase working fluid 60 in the wick 6 through the casing 2a of the evaporator 2. The heat evaporates the liquid-phase working fluid 60 into the gas-phase working fluid 60. The working fluid 60 that has evaporated and changed into the gas phase is circulated to the vapor line 4 through the groove 11. Further, the gas-phase working fluid 60 is circulated to the condenser 3 through the vapor line 4. In the condenser 3, the heat of the working fluid 60 passing through an inside of the condenser 3 is released to an outside of the condenser 3 through the fins. This release of heat lowers a temperature of the working fluid 60, and the working fluid 60 condenses and changes from the gas phase to the liquid phase. The working fluid 60 changed into the liquid phase moves through the liquid line 5 to the evaporator 2 and permeates the wick 6 again from the reservoir 8 by the capillary action. This circulation of the working fluid 60 continuously releases the heat of the heat-generating part to the outside and cools an object to be cooled.

Next, the wick 6 is described in detail.

The wick 6 used for the loop heat pipe 1 according to the present embodiment is made of porous rubber, and may have a porous rubber portion. In the present disclosure, because the wick 6 made of the porous rubber has a higher elasticity than the one made of porous resin, the wick 6 is brought into closer contact with the casing 2a of the evaporator 2. The closer contact between the casing 2a of the evaporator 2 and the wick 6 improves the heat transfer efficiency from the casing 2a of the evaporator 2 to the wick 6 and, as a result, the cooling performance of the loop heat pipe 1.

Figure 3:
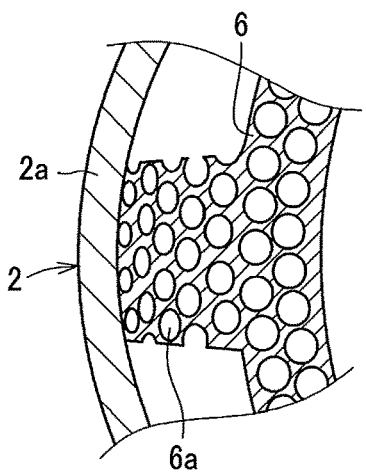
FIG. 3 is an enlarged sectional view illustrating a state in which a wick is compressed in a casing.

The large elastic region of the wick 6 configured by the porous rubber makes it possible to reduce the collapse of the pores in the local area, which is caused by the manufacturing dimensional error. That is, even if the wick 6 is compressed when the wick 6 is accommodated in the casing 2a of the evaporator 2, as illustrated in FIG. 3, the collapse of the pores 6a due to the compressive deformation of the wick 6 is dispersed over a wide range. Therefore, the pores 6a are not greatly squashed in a narrow local area near the outer circumferential surface of the wick 6. Because the pores 6a are not greatly squashed in the narrow local area, a flow of the working fluid 60 is not disturbed. Therefore, the flow of the working fluid 60 becomes smooth and the cooling performance is reliably maintained.

As described above, in the present disclosure, the wick 6 made of porous rubber provides good adhesion between the casing 2a and the wick 6 and minimizes the collapse of the pores 6a in the local area. As a result, both complexity of structure of the wick 6 and increase in manufacturing cost are avoided.

As the porous rubber for the wick 6, foamed silicone rubber or foamed urethane rubber is used. In the porous rubber, a plurality of pores coupled to each other is formed so that the working fluid 60 permeates the porous rubber, and a capillary force of the working fluid 60 is favorably generated. Preferably, an average pore size, a porosity, and an open cell ratio of the porous rubber are respectively set within the following ranges.

Average Pore Diameter

In the porous rubber used for the wick 6, because the capillary force generated by the porous rubber moves the working fluid 60 to drive the loop heat pipe 1, in order to obtain a larger capillary force, it is preferable that the average pore size of the porous rubber is smaller.

In the porous rubber used for the wick 6, a following equation 1 represents a relationship between the average pore size (a pore radius of wick $r_{wick}$) and the capillary force (a capillary pressure $\Delta P_{cap}$).

$$\Delta P_{cap} = 2\sigma \cos\theta / r_{wick} \quad (1)$$

In equation 1, $\sigma$ is a surface tension of the working fluid 60 and $\theta$ is the contact angle between the wick 6 and the working fluid 60.

As can be seen from equation 1, the smaller the pore radius of the wick becomes, the larger the capillary pressure becomes.

Further, in order to drive the loop heat pipe 1, it is necessary that the capillary force (the capillary pressure $\Delta P_{cap}$) and a total pressure loss $\Delta P_{total}$ satisfy the following equation 2.

$$\Delta P_{cap} \geq \Delta P_{total} \quad (2)$$

Further, the total pressure loss $\Delta P_{total}$ is obtained by the following equation 3.

$$\Delta P_{total} = \Delta P_{wick} + \Delta P_{groov} + \Delta P_{VL} + \Delta P_{cond} + \Delta P_{LL} + \Delta P_{grav} \quad (3)$$

In equation 3, $\Delta P_{wick}$ is a pressure loss of the wick 6, $\Delta P_{groov}$ is a pressure loss of the groove 11, $\Delta P_{VL}$ is a pressure loss of the vapor line 4, $\Delta P_{cond}$ is a pressure loss of the condenser 3, $\Delta P_{LL}$ is a pressure loss of the liquid line 5, and $\Delta P_{grav}$ is a pressure loss due to gravity.

As described above, in order to obtain a larger capillary force, it is preferable that the average pore size of the porous rubber be smaller. Specifically, a preferable average pore size is 50 μm or less because an average pore size larger than 50 μm makes it difficult to obtain sufficient capillary force for driving the loop heat pipe 1. Preferably, the average pore size is 10 μm or less. More preferably, the average pore size is 5 μm or less.

The average pore size is obtained by taking a cross section of the porous rubber with a laser microscope, processing an obtained image, and measuring the area of the pores in the obtained image.

Porosity

A higher porosity of the porous rubber used for the wick 6 drives the loop heat pipe 1 more advantageously. Specifically, the porosity of the porous rubber is preferably 20% or more. A porosity less than 20% makes it difficult to drive the loop heat pipe 1. More preferably, the porosity is 50% or more. The porosity is calculated by a following equation 4.

Porosity [%]=(Specific gravity of porous rubber–Specific gravity of solid rubber)/(Specific gravity of solid rubber)×100 (4)

Open Cell Ratio

A greater open cell ratio of the porous rubber used in the wick 6 makes it more advantageous for the liquid-phase working fluid 60 to permeate the wick 6. Specifically, an open cell ratio of the porous rubber is preferably 25% or more, more preferably 50% or more, more preferably still 75% or more.

The open cell ratio is obtained by measuring a weight increase rate in methanol immersion. Specifically, a test piece (cylindrical shape having a diameter of about 29 mm and a thickness of about 12.5 mm) used for measuring the compression set based on JIS 6249 is prepared, and this test piece is immersed in a metal can having a capacity of about 1 L filled with 500 g of methanol. The metal can is covered and left in an atmosphere at 25° C. For a sample whose specific gravity is small and floats, a liquid surface of the methanol is covered by a metal mesh. Then, from the weight before immersion and 24 hours after immersion, the weight increase rate is calculated by the following equation 5.

Weight increase rate [%]=(Weight 24 hours after immersion–Weight before immersion)/Weight before immersion×100 (5)

Method for Manufacturing Porous Rubber

The porous rubber used for the wick 6 is produced by chemical foaming method or water foaming method. The chemical foaming method is a method in which addition of a blowing agent forms a foamed structure. On the other hand, the water foaming method is a method of emulsifying a liquid rubber and a solvent containing water as a main component and removing the solvent to form a foamed structure. In particular, the water foaming method makes it possible to form finer and uniform pores with higher porosity than the chemical foaming method. Therefore, in order to adjust the foamed state of the porous rubber to the above-mentioned preferable range (the average pore size is 50 μm or less, the porosity is 20% or more and 80% or less, and the open cell ratio is 25% or more and 100% or less), it is preferable to use the water foaming method.

Hereinafter, a method for manufacturing foamed silicone rubber for the wick 6 by using the water foaming method is described.

Method for Manufacturing Water Foamed Silicone Rubber

To produce the foamed silicone rubber by the water foaming method, a catalyst, a surfactant, and a crosslinking agent are added to a commercially available two-liquid type liquid silicone rubber and mixed. If necessary, additives, fillers, dispersants and the like are mixed with water as a solvent (if necessary, mixed with alcohol), and the mixture is stirred together with a mixed solution having the same viscosity as the liquid silicone rubber to prepare an emulsion composition (an emulsification process).

The compounding ratio of the liquid silicone rubber and the mixed solution is adjusted by the desired porosity. As the particulate moisture in the emulsion evaporates to form a cell, for example, when the blending ratio of the liquid silicone rubber and the mixed solution is 1:1, a porous body with a porosity of 50% is obtained.

In preparing the emulsion, a homogenizer and, if necessary, a stirring machine for ultrasonic treatment is used. Various stirring conditions such as stirring means, stirring time, stirring speed (for example, 300 to 1500 rpm) are adjusted in order to obtain a cell distribution that satisfies the above conditions.

After stirring, the prepared emulsion composition is poured into a mold, and primary heating is carried out to harden the silicone rubber without evaporating water in the emulsion composition and mold the emulsion composition into a predetermined shape (a primary heating and molding process). The primary heating is carried out at a heating temperature of 80 to 130° C. and a heating time of 30 to 120 minutes. In particular, it is preferable that the heating temperature is 90 to 110° C. and the heating time is 60 to 90 minutes.

Next, secondary heating is carried out to remove moisture from the porous body after primary heating (a secondary heating process). The secondary heating is carried out at a heating temperature of 150 to 300° C. and a heating time of 1 to 24 hours. In particular, it is preferable that the heating temperature is 200 to 250° C. and the heating time is 3 to 5 hours. By performing such secondary heating, moisture is removed from the porous body, and the final curing of the silicone rubber is completed.

Next, a method for adjusting the average pore size, the porosity, and the open cell ratio of the silicone rubber made by the water foaming method is described.

A Method for Adjusting the Average Pore Size

The average pore size is adjusted by changing the stirring strength of the stirring machine in the emulsification process. In the emulsification process, the stirring machine stirs the solvent containing water as a main component to form a fine particle-shaped cell. In the secondary heating process after the emulsification process, evaporation of the moisture of the solvent forms the pores. Therefore, stirring the solvent to make a finer particle-shaped cell in the emulsification step makes the average pore size smaller. Specifically, selection of stirring conditions to strengthen the stirring strength, such as long stirring time and fast stirring speed makes it possible to adjust the average pore size to be small.

A Method for Adjusting the Porosity

The porosity can be adjusted by changing the mixing ratio of the liquid silicone rubber and the mixed solution. This is because evaporation of moisture in the mixed solution forms the pores. A high ratio of the mixed solution to the liquid silicone rubber increases the porosity.

A Method for Adjusting the Open Cell Ratio

The open cell ratio can be adjusted by selecting the amount or type of surfactant of the silicone rubber composition.

Next, a method for manufacturing a foamed urethane rubber for the wick 6 by using the water foaming method is described.

A Method for Manufacturing Water Foamed Urethane Rubber

Water foamed urethane rubber can be manufactured by using liquid urethane rubber instead of liquid silicone rubber in the above-mentioned method for manufacturing water foamed silicone rubber. As the liquid urethane rubber, commercially available liquid urethane rubber of one liquid type or two liquid type is used. From the viewpoint of water resistance, a urethane material is preferably ether type. From the viewpoint of heat resistance, it is desirable that the primary heating temperature and the secondary heating temperature are lower than endurance temperature of the urethane material. The primary heating temperature is preferably a temperature at which the material does not deteriorate, which is selected in a range of 70 to 110° C. Similarly, the secondary heating temperature is preferably a temperature at which the material does not deteriorate, which is selected in a range of 80 to 110° C. The average pore diameter, the porosity, and the open cell ratio of the water foamed urethane rubber can be adjusted by the same method as the above-described method for adjusting the water foamed silicone rubber.

A cooling performance test of the loop heat pipes 1 is described below.

Cooling Performance Test

In this test, multiple wick samples listed in Table 1 below were made with water foamed silicone rubber. Using each sample, the loop heat pipe 1 was prepared and the cooling performance test was conducted.

TABLE 1

| Sample number | 1 | 2 | 3 | 4 | 5 | 6 | 7 | 8 | 9 | 10 | 11 |
|---|---|---|---|---|---|---|---|---|---|---|---|
| Average pore size [μm] | 8 | 8 | 20 | 8 | 5 | 12 | 8 | 8 | 1 | 30 | 48 |
| Porosity [%] | 47 | 56 | 52 | 47 | 52 | 52 | 25 | 75 | 46 | 53 | 54 |
| Open cell ratio [%] | 78 | 100 | 31 | 78 | 100 | 100 | 32 | 100 | 71 | 100 | 100 |

The wick 6 of sample 1 was prepared under the following conditions.

Firstly, a crosslinking agent and a surfactant were added to the liquid silicone rubber, and water was mixed in a volume ratio of 1:1 to prepare a silicone rubber composition liquid. Secondary, the prepared composition liquid was stirred at 1500 rpm for 10 minutes with the homomixer manufactured by PRIMIX to obtain the emulsion composition. Then, this emulsion composition was poured into a metal mold, primary heating was carried out at 100° C. for one hour, and secondary heating was carried out at 230° C. for four hours. This results in a water foamed silicone rubber having the average pore size of 8 μm, the porosity of 47% and the open cell ratio of 78%. In addition, the water foamed silicone rubber after molding was a cylindrical shape having an outer diameter of 18 mm and an inner diameter of 14 mm. In the cylindrical shape, one end was opened and the other end was closed. On an outer peripheral surface of the cylindrical shape, eight grooves having a width of 3 mm, a depth of 1 mm, and a length of 70 mm were formed along the circumferential direction.

Other Samples 2 to 11 were manufactured using the same mold as Sample 1 described above. The average pore size, the porosity, and the open cell ratio of each sample was appropriately adjusted by the above-described adjustment method.

The wick 6 of each sample was used for the loop heat pipe 1 having the same configuration as the loop heat pipe 1 illustrated in FIG. 1. Specifically, the evaporator 2 included the heat receiving portion 7 in which the wick 6 is accommodated and the reservoir 8 that stores the liquid-phase working fluid 60. The heat receiving portion 7 and the reservoir 8 were integrated. The heat receiving portion 7 was a cylinder having an outer diameter of 20 mm, an inner diameter of 18 mm and a length of 80 mm. The reservoir was a cylinder having an outer diameter of 70 mm, an inner diameter of 68 mm, and a length of 40 mm. The condenser 3 included a stainless steel pipe having an outer diameter of 10 mm. The stainless steel pipe was attached 80 aluminum fins having a thickness of 0.3 mm and a side length of 100 mm at intervals of 10 mm. The vapor line was made of a stainless steel pipe having an outer diameter of 4 mm, an inner diameter of 2 mm and a length of 600 mm. The liquid line was also made of a stainless steel pipe having an outer diameter of 4 mm, an inner diameter of 2 mm and a length of 600 mm. As the working fluid 60, 100 ml of ethanol or acetone was sealed. Only loop heat pipe 1 using sample 4 was filled with acetone, and other loop heat pipes 1 using other samples were filled with ethanol. The contact angle between the wick and the working fluid 60 of each sample was less than 90°.

Measurement of Contact Angle

The contact angle was measured with a contact angle meter DropMaster 100 manufactured by Kyowa Interface Science Co., Ltd. Measurement was performed 500 ms after dropping the working fluid 60 on the wick material. The contact angle was calculated using the droplet method (adopting a θ/2 method, no curvature correction) with the attached software "solid-liquid interface analysis system DropMaster 700".

The loop heat pipe 1 prepared was placed so that the evaporator 2 and the condenser 3 were horizontal, and the heater was brought into contact with the evaporator 2. The application power to the heater was adjusted to apply a heat quantity of 100 W for 10 minutes, and a temperature of the evaporator was measured.

From the temperature of the evaporator 2, the room temperature, and the applied heat quantity, the thermal resistance was obtained using the following equation 6.

Thermal resistance [° C./W]=(Temperature of evaporator [° C.]−Room temperature [° C.])/Heat quantity [W]   (6)

Further, it is confirmed whether the loop heat pipe drives in a state in which the evaporator is disposed at a position higher than the condenser and given a water head difference, that is, in a state of top heat, and a maximum water head difference at which the loop heat pipe is drivable was measured. When the loop heat pipe drove even when the water head difference became 500 mm, the maximum water head difference at which the loop heat pipe is drivable was recorded as 500 mm or more.

The results of this test are illustrated in Table 2 below.

TABLE 2

| Sample number | 1 | 2 | 3 | 4 | 5 | 6 | 7 | 8 | 9 | 10 | 11 |
|---|---|---|---|---|---|---|---|---|---|---|---|
| Temperature of Evaporator [° C.] | 53 | 52 | 54 | 52 | 51 | 53 | 55 | 50 | 53 | 52 | 52 |
| Thermal resistance [° C./W] | 0.28 | 0.27 | 0.29 | 0.27 | 0.25 | 0.28 | 0.3 | 0.25 | 0.28 | 0.27 | 0.27 |
| Maximum water head difference [mm] | 500 or more | 500 or more | 300 | 500 or more | 500 or more | 430 | 500 or more | 500 or more | 500 or more | 60 | 40 |

According to results illustrated in Table 2, the loop eat pipe 1 of each sample has the thermal resistance in a range of 0.25 to 0.30° C./W when a temperature of the evaporator is in a range of 50 to 55° C., which is a low value that is a good cooling performance. That is, according to the data of each sample illustrated in Table 1, the wick made of water foamed silicone rubber can effectively cool the heat-generating part when the wick has the average pore size of 50 μm or less, the porosity of 20% or more and 80% or less, and the open cell ratio of 25% or more and 100% or less. However, in the sample having the average pore diameter of more than 10 μm, such as Sample 3, Sample 6, Sample 10, and Sample 11, the maximum water head difference at which the loop heat pipe 1 can drive is lower than that of other samples having the average pore diameter of 10 μm or less. In particular, when Sample 6, Sample 10, and Sample 11 are compared, the following can be seen. That is, though the porosity and the open cell ratio are almost the same, as the average pore size increases, the maximum water head difference becomes smaller. It is considered that this is because the capillary force is reduced by the large average pore size.

Therefore, the test results shows the average pore size of 10 μm or less is preferable in order that the capillary force of the wick moves the working fluid 60 and drives the loop heat pipe more effectively.

Further, the same test as the above test was also conducted in the loop heat pipe 1 using the wick 6 made of water foamed urethane rubber.

The following Table 3 illustrates data of each sample of the wicks 6 used in the test.

TABLE 3

| Sample number | 12 | 13 | 14 | 15 | 16 | 17 | 18 | 19 | 20 | 21 | 22 |
|---|---|---|---|---|---|---|---|---|---|---|---|
| Average pore size [μm] | 8 | 8 | 20 | 8 | 5 | 12 | 8 | 8 | 1 | 30 | 48 |
| Porosity [%] | 45 | 51 | 56 | 48 | 50 | 53 | 26 | 76 | 42 | 52 | 54 |
| Open cell ratio [%] | 78 | 100 | 31 | 78 | 100 | 100 | 32 | 100 | 73 | 100 | 100 |

The wick 6 of sample 12 was prepared under the following conditions.

Firstly, a crosslinking agent and a surfactant were added to the liquid urethane, and water was mixed in a volume ratio of 1:1 to prepare a urethane rubber composition liquid. Secondary, the prepared composition liquid was stirred at 1500 rpm for 10 minutes with a homomixer manufactured by PRIMIX to obtain an emulsion composition. Then, this emulsion composition was poured into a metal mold, primary heating was carried out at 80° C. for 20 minutes, and secondary heating was carried out at 110° C. for one hour. This results in a water foamed urethane having the average pore size of 8 μm, the porosity of 45% and the open cell ratio of 78%. In addition, the water foamed urethane rubber after molding was a cylindrical shape having an outer diameter of 18 mm and an inner diameter of 14 mm. In the cylindrical shape, one end was opened and the other end was closed. On an outer peripheral surface of the cylindrical shape, eight grooves having a width of 3 mm, a depth of 1 mm, and a length of 70 mm were formed along the circumferential direction.

Other Samples 13 to 22 were manufactured using the same mold as Sample 12 described above. The average pore size, the porosity, and the open cell ratio of each sample was appropriately adjusted by the above-described adjustment method.

The wick 6 of each sample was used for the loop heat pipe 1 similar to the above test. As the working fluid 60, 100 ml of ethanol or acetone was sealed. Only loop heat pipe 1 using sample 15 was filled with acetone, and other loop heat pipes 1 using other samples were filled with ethanol. The contact angle between the wick 6 and the working fluid 60 of each sample was less than 90°.

The following Table 4 illustrates results of the cooling performance test of the wicks 6 using water foamed urethane rubber.

TABLE 4

| Sample number | 12 | 13 | 14 | 15 | 16 | 17 | 18 | 19 | 20 | 21 | 22 |
|---|---|---|---|---|---|---|---|---|---|---|---|
| Temperature of Evaporator [° C.] | 57 | 55 | 59 | 57 | 56 | 58 | 60 | 55 | 58 | 57 | 58 |
| Thermal resistance [° C./W] | 0.32 | 0.30 | 0.34 | 0.32 | 0.31 | 0.30 | 0.35 | 0.30 | 0.33 | 0.32 | 0.33 |
| Maximum water head difference [mm] | 500 or more | 500 or more | 390 | 500 or more | 500 or more | 480 | 500 or more | 500 or more | 500 or more | 100 | 70 |

According to results illustrated n Table 4, if the wick 6 using water foamed urethane rubber has the average pore size of 50 μm or less, the porosity of 20% or more and 80% or less, and the open cell ratio of 25% or more and 100% or less, the loop heat pipe 1 has the thermal resistance in a range of 0.30 to 0.35° C./W when a temperature of the evaporator 2 is in a range of 55 to 60° C., which is a low value that is a good cooling performance. However, in the sample having the average pore diameter of more than 10 μm, such as Sample 14, Sample 17, Sample 21, and Sample 22, the maximum water head difference at which the loop heat pipe 1 can drive is lower than that of other samples having the average pore diameter of 10 μm or less. It is considered that this is because the capillary force is reduced by the large average pore size in the case of using water foamed urethane rubber as the case of using water foamed silicone rubber. Therefore, the test results illustrated in Table 4 shows the average pore size of 10 μm or less is preferable in order that the capillary force of the wick 6 moves the working fluid 60 and drives the loop heat pipe 1 more effectively when the water foamed urethane rubber is used.

Further, a sample of porous rubber produced by the chemical foaming method was prepared, and the same test as the above test was carried out.

The following Table 5 illustrates each sample of the porous rubber produced by the chemical foaming method.

TABLE 5

| Sample number | 23 | 24 | 25 |
|---|---|---|---|
| Average pore size [μm] | 100 | 250 | 58 |
| Porosity [%] | 50 | 55 | 19 |
| Open cell ratio [%] | 19 | 35 | 16 |

In this case, the wick 6 of each sample was used for the loop heat pipe 1 similar to the above test. As a work fluid, 100 ml of ethanol was sealed. The contact angle between the wick 6 and the working fluid 60 of each sample was less than 90°.

The following Table 6 illustrates results of the cooling performance test when the chemical foamed porous rubber is used as the wick 6.

TABLE 6

| Sample number | 23 | 24 | 25 |
|---|---|---|---|
| Temperature of Evaporator [° C.] | — | — | 65 |
| Thermal resistance [° C./W] | — | — | 0.40 |
| Maximum water head difference [mm] | — | — | 40 |

As illustrated in Table 6, in the case of Sample 23 and Sample 24, because the average pore size was large, the capillary force became smaller than the total pressure loss of the loop heat pipe 1, and the loop heat pipe 1 did not drive. Therefore, the cooling Performance could not be confirmed. In the wick 6 made of the sample 25, although the wick 6 could drive the loop heat pipe 1, the temperature of the evaporator and the thermal resistance were higher than those of samples described above that were made of water foamed silicone rubber and water foamed urethane rubber. This is because all of the average pore diameter, the porosity, and the open cell ratio of the porous rubber of Sample 25 are not in the above-mentioned preferable ranges (that is, the average pore diameter is 50 μm or less, the porosity is 20% or more and 80% or less, and the open cell ratio is 25% to 100%).

As described above, the water foaming method makes it possible to form finer and uniform pores with higher porosity than the chemical foaming method. Therefore, the loop heat pipe 1 using the wick 6 manufactured by the water foaming method (for example, the wick 6 made of the water foamed silicone rubber or water foamed urethane rubber) exhibits stable and good cooling performance. That is, the water foaming method enables manufacturing the wick 6 that has a large capillary force so that the working fluid 60 easily permeates the wick 6 because the water foaming method can adjust the foamed state of the porous rubber to be in the above-mentioned preferable range (that is, the average pore size is 50 μm or less, the porosity is 20% or more and 80% or less, the open cell ratio is 25% or more and 100% or less). Further, the water foaming method is also suitable for mass production of the porous rubber for the wick 6 (for example, water foamed silicone rubber or water foamed urethane rubber).

Tests were conducted to check how a relative relationship between the SP value of the wick 6 and the SP value of the working fluid 60 and the contact angle between the wick 6 and the working fluid 60 affect the cooling performance of the loop heat pipe 1.

Table 7 below lists the material, the manufacturing method, the average pore size, the porosity, and the open cell ratio of each wick sample used in this test, and the type of the working fluid 60, the SP values of the working fluid 60 and the wick 6, SP value difference between the working fluid 60 and the wick 6, and the contact angle between the wick 6 and the working fluid 60. As the working fluid 60, HFE-347 (AE-3000 manufactured by Asahi Glass Co., Ltd.) that is one of fluorinated solvents or pure water was used. Conditions of manufacturing samples by the water foaming method in this test, and the method of adjusting the average pore size, the porosity, and the open cell ratio are the same as those of the water foaming method in the above test. Additionally, the loop heat pipe 1 used in this test was similar to the one used in the above test.

Table 7

TABLE 7

| Sample number | | 26 | 27 | 28 | 29 |
|---|---|---|---|---|---|
| Wick | material | Silicon rubber | Urethane rubber | Silicon rubber | Urethane rubber |
| | Manufacturing method | Water foaming | Water foaming | Water foaming | Water foaming |
| | Average pore size [μm] | 8 | 8 | 8 | 8 |

TABLE 7-continued

| Sample number | | 26 | 27 | 28 | 29 |
|---|---|---|---|---|---|
| | Porosity [%] | 45 | 45 | 45 | 45 |
| | Open cell ratio [%] | 78 | 78 | 78 | 78 |
| | Type of working fluid | HFE-347 | HFE-347 | Water | Water |
| SP value | Working fluid | 7.6 | 7.6 | 22.4 | 22.4 |
| | Wick | 7.3 | 9.9 | 7.3 | 9.9 |
| | Difference | 0.3 | −2.3 | 15.1 | 12.5 |
| | Contact angle [deg.] | 29 | 27 | 110 | 100 |

The results of this test are illustrated in Table 8 below.

The measuring methods of the temperature of the evaporator, the thermal resistance, and the maximum water head difference in this test are the same as those in the above test.

TABLE 8

| Sample number | 26 | 27 | 28 | 29 |
|---|---|---|---|---|
| Temperature of Evaporator [° C.] | 64 | — | — | — |
| Thermal resistance [° C./W] | 0.39 | — | — | — |
| Maximum water head difference [mm] | 500 or more | — | — | — |

As illustrated in Table 8, the loop heat pipe 1 using Sample 26 drove well and showed cooling performance. However, the loop heat pipe 1 using the other samples 27 to 29, did not work. Therefore, the cooling performance could not be evaluated.

Specifically, in the case of Sample 27, because the wick 6 melted, the cooling performance could not be evaluated. It is considered that this is because the SP value of the working fluid 60 is smaller than the SP value of the wick 6. Therefore, it is preferable that the combination of the working fluid 60 and the wick material used for the loop beat pipe is such that the SP value of the working fluid 60 is larger than the SP value of the wick material.

In the case of Sample 28 and 29, because the working fluid 60 did not permeate the wick 6, the loop heat pipe 1 did not work. Therefore, the cooling performance could not be confirmed. It is considered that this is because the contact angle between the wick 6 and the working fluid 60 was 90° or more. Therefore, it is preferable that the contact angle between the wick 6 and the working fluid 60 is less than 90° in order to allow the working fluid 60 to permeate the wick 6 to exhibit the cooling performance.

Figure 4:
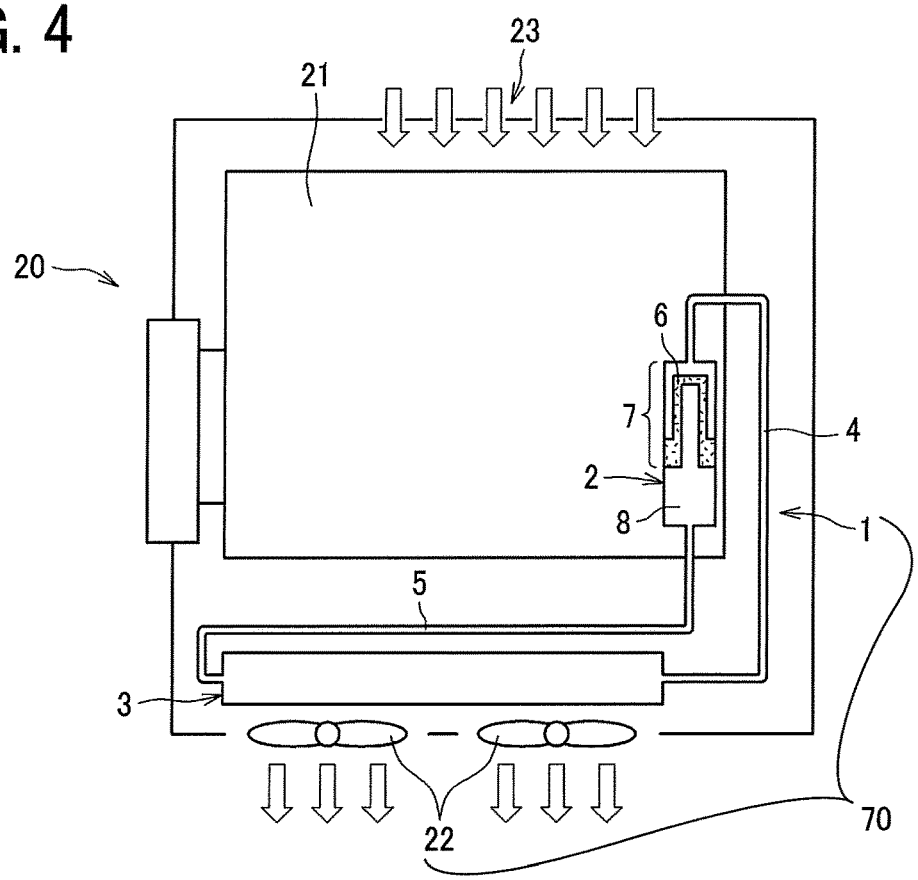
FIG. 4 is a schematic diagram illustrating an example of an electronic device including the loop heat pipe according to the embodiment.
Figure 5:
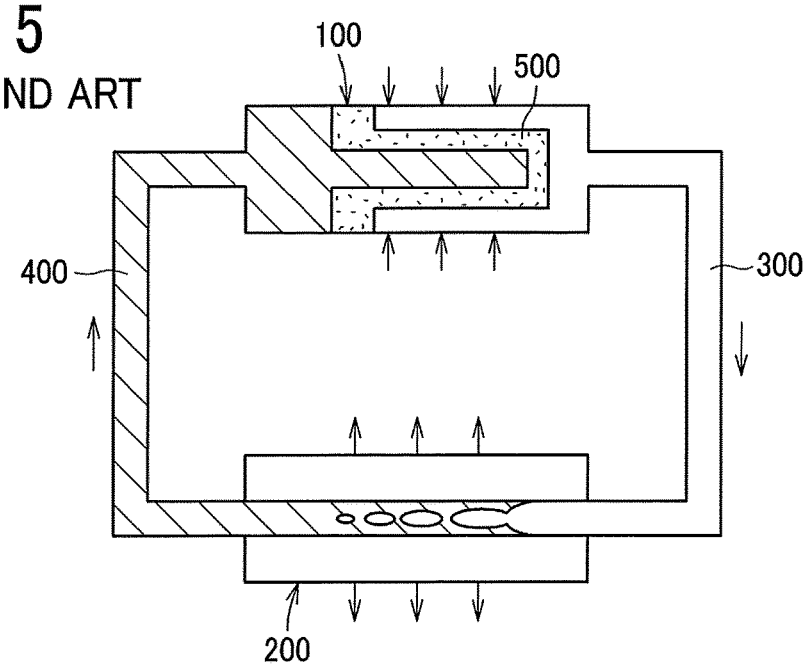
FIG. 5 is a schematic diagram illustrating a configuration of a loop heat pipe according to background art.

FIG. 4 is a schematic diagram illustrating an electronic device 20 including the loop heat pipe 1 according to the present embodiment.

The electronic device 20 illustrated in FIG. 4 is a projector including an optical unit 21, and is an example of an electronic device to which the present disclosure is applied. Accordingly, the present disclosure is not limited to a projector but may be applied to various types of electronic devices, for example, image forming apparatuses such as a printer, a copier, a facsimile machine, or a multifunction peripheral thereof, a personal computer, a server, an electronic blackboard, a television, a Blu-ray recorder, a game machine.

The evaporator 2 (particularly the heat receiving portion 7) of the loop heat pipe 1 is disposed to contact the heat-generating part of the optical unit 21. The evaporator 2 absorbs heat from the heat-generating part and cools the object to be cooled (the heat-generating part, the optical unit, or the projector). The condenser 3 is located near an exhaust fan 22 disposed on the side plate of the projector. The exhaust fan 22 discharges air to the outside and generates an air current around the condenser 3. This air current cools the condenser 3 and enhances heat dissipation in the condenser 3. An air inlet 23 is disposed on a side plate opposite to the side plate on which is disposed the exhaust fan 22. The air drawn from the air inlet 23 passes through the interior of the projector and is discharged by the exhaust fan 22.

In the embodiment of FIG. 4, the cooling device 70 for cooling the projector is the loop heat pipe 1 and the exhaust fan 22 that enhances the heat radiation effect of the loop heat pipe 1. However, instead of the exhaust fan 22, alternatively a blower fan for blowing air to the condenser 3 may be provided. Further alternatively, the cooling device 70 may include only the loop heat pipe 1 and not include the fan 22.

The loop heat pipe 1 according to the present disclosure and the cooling device 70 using the same may also be applied to devices other than electronic devices. For example, the loop heat pipe 1 and the cooling device 70 according to the present disclosure may be applied to a cooling device 70 for cooling a chemical plant or the like provided with a reaction furnace.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:

1. An electronic device comprising:
    a heat generation section; and
    a loop heat pipe comprising:
        a loop heat pipe wick including porous foamed silicone rubber, the porous foamed silicone rubber including:
            an average pore size of 10 μm or less,
            a porosity of from 20% to 80%, and
            an open cell ratio of from 50% to 100%;
        a working fluid;
        an evaporator including the wick which receives heat from the heat generating section;
        a condenser;
        a vapor line connected between the evaporator and the condenser which transports the working fluid which has been heated in the evaporator into vapor from the evaporator to the condenser; and
        a liquid line connected between the condenser and the evaporator which transports the working fluid which has been cooled to liquid form by the condenser from the condenser to the evaporator.

2. The electronic device according to claim 1, wherein a contact angle between the wick and the working fluid is less than 90°.

3. The electronic device according to claim 1, wherein a solubility parameter (SP) value of the working fluid is greater than an SP value of the wick.

4. The electronic device according to claim 1, wherein the average pore size is 5 μm or less.

5. The electronic device according to claim 1, wherein the porosity is 50% to 80%.

6. The electronic device according to claim 1, wherein the open cell ratio is from 75% to 100%.

7. The electronic device according to claim 1, wherein:
the evaporator includes a reservoir to hold the working fluid in liquid form prior to being changed to vapor form in the evaporator.

8. The electronic device according to claim 7, wherein:
the evaporator includes grooves.

9. The electronic device according to claim 1, wherein:
the heat generating section includes optics.

10. The electronic device according to claim 9, wherein:
the electronic device is a projector.

11. The electronic device according to claim 9, wherein:
the electronic device is a copier.

12. The electronic device according to claim 1, wherein the porous foamed silicone rubber is water foamed silicone rubber.

* * * * *